(12) United States Patent  
Sato

(10) Patent No.: US 11,592,402 B2  
(45) Date of Patent: Feb. 28, 2023

(54) CONNECTING DEVICE FOR INSPECTION

(71) Applicant: Kabushiki Kaisha Nihon Micronics, Tokyo (JP)

(72) Inventor: Minoru Sato, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 17/392,214

(22) Filed: Aug. 2, 2021

(65) Prior Publication Data

US 2022/0034821 A1  Feb. 3, 2022

(30) Foreign Application Priority Data

Aug. 3, 2020 (JP) .............................. JP2020-131467

(51) Int. Cl.
| | | |
|---|---|---|
| G01N 21/88 | (2006.01) | |
| G01N 21/95 | (2006.01) | |
| H01L 21/66 | (2006.01) | |

(52) U.S. Cl.
CPC ..... *G01N 21/8806* (2013.01); *G01N 21/9501* (2013.01); *H01L 22/12* (2013.01)

(58) Field of Classification Search
CPC . G01N 21/8806; G01N 21/9501; H01L 22/12
See application file for complete search history.

(56) References Cited

U.S. PATENT DOCUMENTS 10,969,442 B2 * 4/2021 Arai .................... G01R 31/2886  
2021/0208182 A1 * 7/2021 Lou ..................... G01R 1/07307

FOREIGN PATENT DOCUMENTS

JP  2008241808 A  10/2008

* cited by examiner

*Primary Examiner* — Hung V Nguyen  
(74) *Attorney, Agent, or Firm* — Lorenz & Kopf, LLP

(57) ABSTRACT

A connecting device for inspection includes optical probes, and a probe head including a plurality of guide plates. The probe head includes a first guide plate, and a second guide plate arranged movably with respect to the first guide plate in a radial direction of the penetration holes in a state in which the optical probes are inserted to the respective penetration holes. The probe head holds the optical probes by inner wall surfaces of the penetration holes of the first guide plate and inner wall surfaces of the penetration holes of the second guide plate in a state in which the positions of the central axes of the penetration holes of the first guide plate are shifted in the radial direction from the positions of the central axes of the penetration holes of the second guide plate.

5 Claims, 15 Drawing Sheets

CONNECTING DEVICE FOR INSPECTION

CROSS-REFERENCE TO RELATED APPLICATIONS

This application is based upon and claims the benefit of priority from prior Japanese Patent Application P2020-131467, filed on Aug. 3, 2020, the entire contents of which are incorporated by reference herein.

BACKGROUND

Technical Field

Embodiments described herein relate generally to connecting devices for inspection used for inspecting the characteristics of optical semiconductor elements.

Description of the Related Art

To inspect the characteristics of optical semiconductor elements formed in a wafer, it is effective to connect the optical semiconductor elements and an inspection device by use of a connecting device for inspection including optical probes that transfer optical signals output from the optical semiconductor elements. Optical fibers are used for the optical probes, for example.

The connecting device for inspection including the optical probes is sometimes required to replace the optical probes depending on a damage or characteristic deterioration of the respective optical probes. The connecting device for inspection thus needs to have a configuration that facilitates the replacement of the optical probes. The connecting device for inspection, particularly when including a large number of optical probes, is also required to have a configuration that enables the alignment of the optical probes to be executed easily.

BRIEF SUMMARY

A connecting device for inspection according to an embodiment includes an optical probe, and a probe head including a plurality of guide plates each provided with a penetration hole through which the optical probe penetrates, the guide plates arranged separately from each other in a central axis direction of the respective penetration holes. The probe head includes a first guide plate, and a second guide plate arranged movably with respect to the first guide plate in a radial direction of the penetration holes in a state in which the optical probe is inserted to the respective penetration holes. The probe head holds the optical probe by an inner wall surface of the penetration hole of the first guide plate and an inner wall surface of the penetration hole of the second guide plate in a state in which a position of a central axis of the penetration hole of the first guide plate is shifted in the radial direction from a position of a central axis of the penetration hole of the second guide plate.

DETAILED DESCRIPTION

Figure 1:
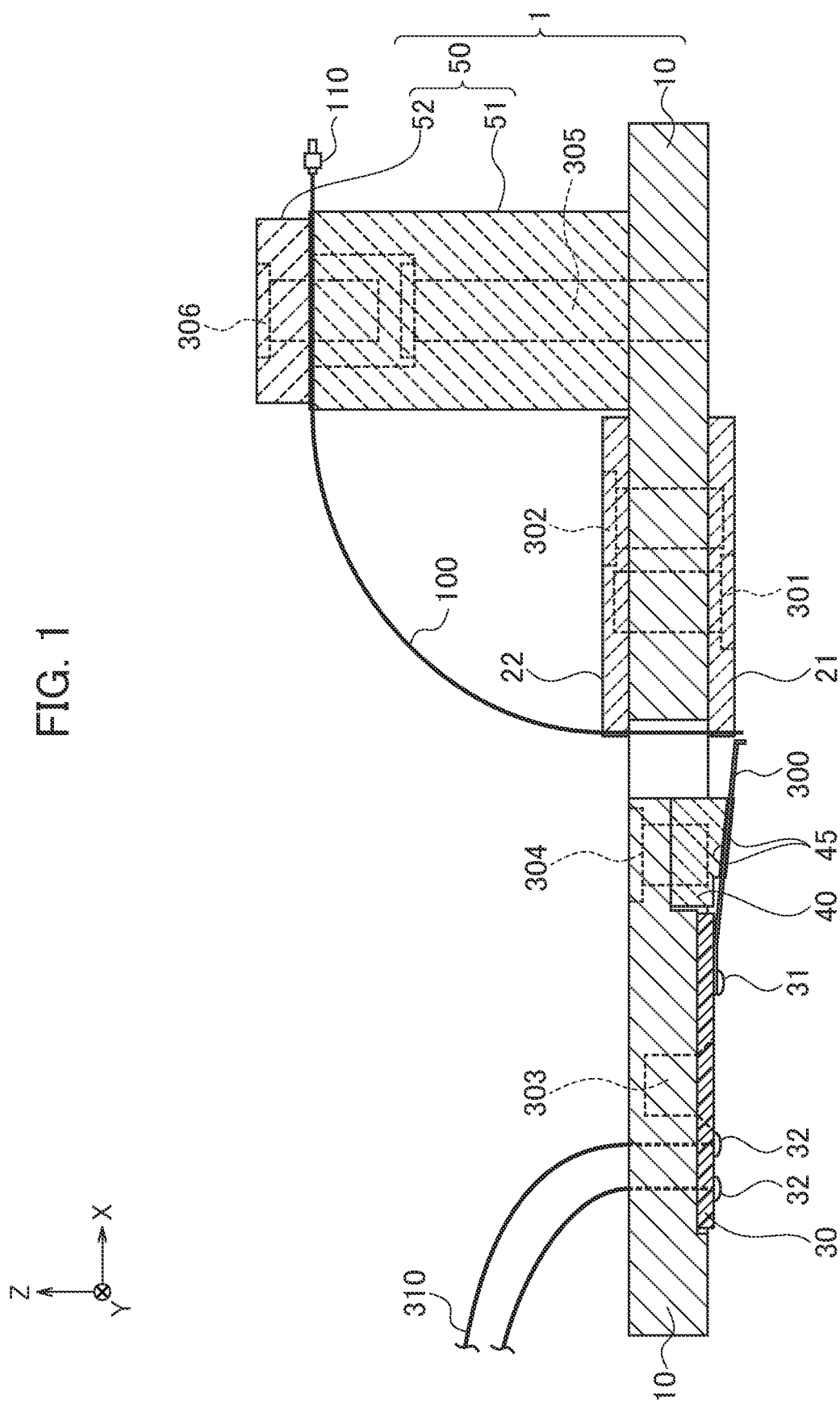
FIG. 1 is a schematic cross-sectional view illustrating a configuration of a connecting device for inspection according to an embodiment of the present invention.

Next, a description will be given of embodiments of the present invention with reference to the drawings. In the following description referring to the drawings, the same or similar reference numerals are assigned to the same or similar portions. However, it should be noted that the drawings are schematic, and that a ratio of thicknesses of respective portions, and the like are different from actual ones. Moreover, as a matter of course, also between the drawings, portions where dimensional relationship and ratio therebetween are different from each other are also included. The embodiments illustrated below are exemplifying a device and a method for embodying the technical idea of this invention, and the embodiments of this invention do not specify materials, shapes, structures, dispositions and the like of constituent components to those described below.

A connecting device for inspection according to an embodiment of the present invention illustrated in FIG. 1 is used for inspecting an optical semiconductor element that outputs an optical signal. The optical semiconductor element as used herein may be any type of optical semiconductor elements, and is a vertical cavity surface emitting laser (VCSEL), for example.

As used herein, the term "lower side" refers to a side on which the optical semiconductor element when inspected is located with respect to the connecting device for inspection. The surface on the lower side is referred to below as a "lower surface". The surface on the lower side is opposed to the optical semiconductor element when inspected. The term "upper side" refers to the opposite side of the lower side. The surface on the upper side is referred to below as an "upper surface".

The connecting device for inspection illustrated in FIG. 1 includes an optical probe 100, and a probe head 1 including a plurality of guide plates each provided with a penetration hole through which the optical probe 100 penetrates and arranged separately from each other in a central axis direction of the penetration holes. The probe head 1 includes a first guide plate 21, and a second guide plate 22 arranged movably with respect to the first guide plate 21 in the radial direction of the penetration holes in the state in which the optical probe 100 is inserted to the respective penetration holes.

The probe head 1 illustrated in FIG. 1 has a structure in which the first guide plate 21 is arranged on the lower surface of a base plate 10, and the second guide plate 22 is arranged on the upper surface of the base plate 10. The first guide plate 21 and the second guide plate 22 are each a ceramic plate in which the penetration hole is formed by precision processing. The base plate 10 is a metal plate, for example.

FIG. 1 defines a thickness direction of the base plate 10 as a Z-axis direction. FIG. 1 also defines a plane surface perpendicular to the Z-axis direction as an X-Y plane surface, defines a right-left direction of the sheet of FIG. 1 as an X-axis direction, and defines a direction perpendicular to the sheet as a Y-axis direction.

The optical semiconductor element to be inspected, although not illustrated in FIG. 1, is arranged under the first guide plate 21 in the Z-axis direction. Hereinafter, the first guide plate 21 opposed to the optical semiconductor element is also referred to below as a "bottom plate", and the second guide plate 22 is also referred to below as a "top plate". The optical semiconductor element is arranged such that the surface provided with an optical signal terminal and an electrical signal terminal is opposed to the lower surface of the connecting device for inspection.

One tip end surface of the optical probe 100 (referred to below as an "incident end surface") is exposed downward on the first guide plate 21. The incident end surface of the optical probe 100 is positioned to be opposed to the optical semiconductor element so that the incident end surface receives the optical signal output from the optical semiconductor element. The optical probe 100 as used herein may be an optical fiber or have a configuration including an optical fiber and a lens combined together. For example, the optical probe 100 is made of a graded index (GI) optical fiber.

The region through which the optical probe 100 passes between the first guide plate 21 and the second guide plate 22 is a hollow part. The base plate 10 also serves as a spacer for providing a space between the first guide plate 21 and the second guide plate 22.

The optical probe 100 is curved along the X-Y plane surface over the second guide plate 22 after penetrating the second guide plate 22. The optical probe 100 is then held by an optical probe holding device 50 at a position farther away from the optical semiconductor element than the first guide plate 21 and the second guide plate 22. The optical probe holding device 50 includes a lower holding device 51 and an upper holding device 52. The optical probe 100 is placed in a groove provided on the upper surface of the lower holding device 51. The upper holding device 52 is placed over the lower holding device 51. The optical probe holding device 50 thus interposes and holds the optical probe 100 between the lower holding device 51 and the upper holding device 52.

The optical probe 100 at the other tip end is provided with an optical connector 110. The optical signal transmitted through the optical probe 100 is input to an inspection device such as a tester via the optical connector 110. A photoelectric converting device may be provided in the connecting device for inspection so as to photoelectrically convert the optical signal transmitted through the optical probe 100. An electrical signal converted is input to the inspection device.

The connecting device for inspection illustrated in FIG. 1 further includes an electric probe 300, and an electric probe holding device 40 that holds the electric probe 300. The electric probe 300 is electrically connected to the electrical signal terminal of the optical semiconductor element. The electric probe 300 is fixed to the electric probe holding device 40 arranged at the base plate 10 via a resin material 45.

One end part of the electric probe 300 (referred to below as a "tip end part") is exposed downward on the connecting device for inspection. The tip end part of the electric probe 300 is electrically connected to the electrical signal terminal of the optical semiconductor element.

The other end part of the electric probe 300 (referred to below as a "proximal end part") is electrically connected to a first connection terminal 31 of a wiring base plate 30 provided in the connecting device for inspection. The proximal end part of the electric probe 300 and the first connection terminal 31 are connected together by soldering, for example. The wiring base plate 30 includes a second connection terminal 32 electrically connected to the first connection terminal 31 via a wire (not illustrated) provided in the wiring base plate 30. The second connection terminal 32 is connected to an electric wire 310. The electric wire 310 as used herein may be a metallic conductive wire, for example.

The electric probe 300 is electrically connected to the electric wire 310 via the wiring base plate 30, as described above. The electric wire 310 is connected to the inspection device such as a tester, for example. The electric probe 300 as used herein may be an electric probe of any type, such as a cantilever type, a vertical needle type, and a vertical spring type. FIG. 1 illustrates the case of using a cantilever type as the electric probe 300. The electric probe 300 is preferably made of a conducive material such as a metallic material.

The first guide plate 21 is fixed to the base plate 10 with a fixing screw 301. The second guide plate 22 is fixed to the base plate 10 with a fixing screw 302. The wiring base plate 30 is fixed to the base plate 10 with a fixing screw 303. The electric probe holding device 40 is fixed to the base plate 10 with a fixing screw 304. The lower holding device 51 is fixed to the base plate 10 with a fixing screw 305. The upper holding device 52 is fixed to the lower holding device 51 with a fixing screw 306. The fixing screws 301 to 306 are also collectively referred to below as "fixing screws". The fixing screws as used herein may each be a screw pin, for example.

Figure 2:
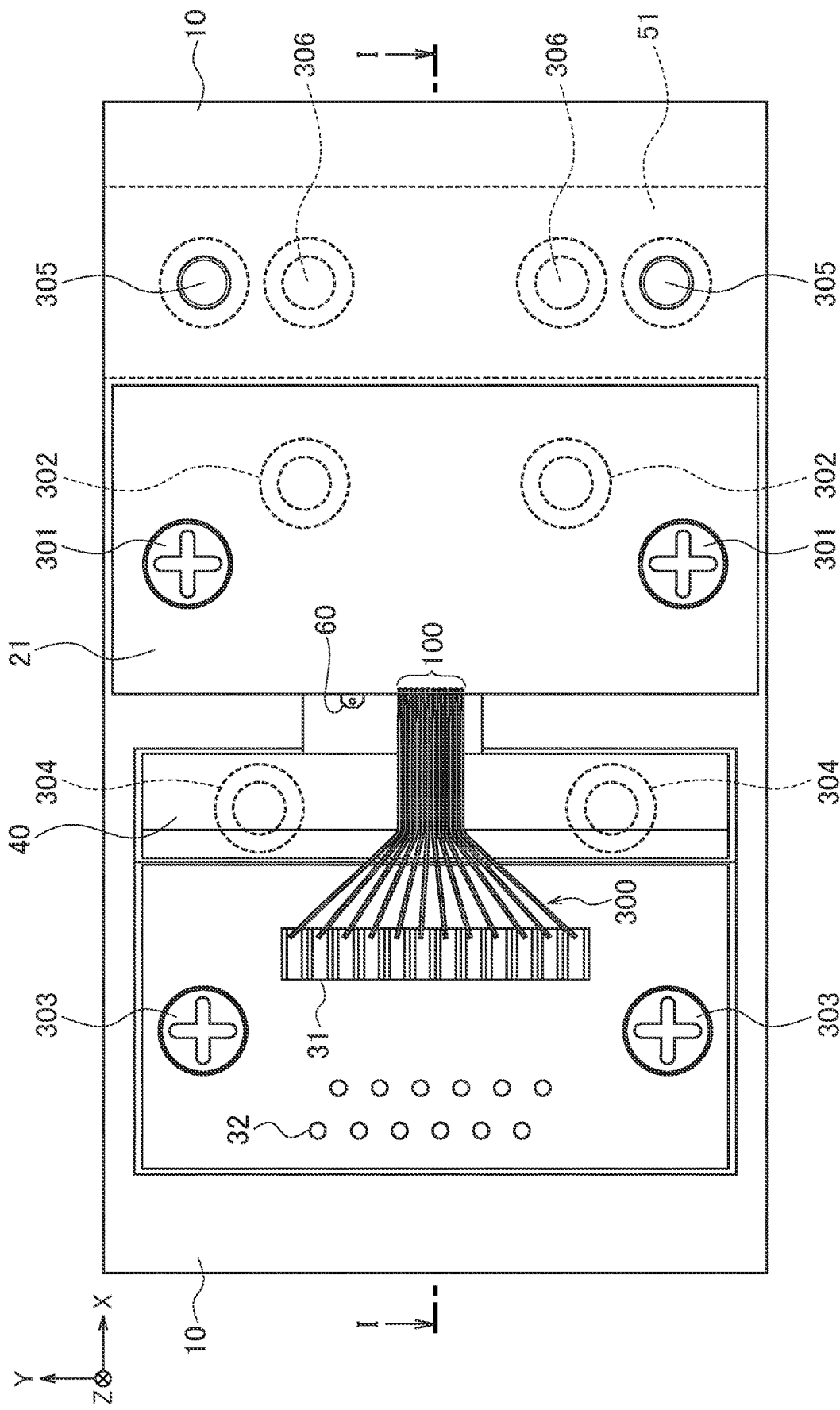
FIG. 2 is a schematic bottom view of the connecting device for inspection according to the embodiment of the present invention.

FIG. 2 is a bottom view of the connecting device for inspection. FIG. 1 is a cross-sectional view taken along the direction I-I in FIG. 2. The bottom view of FIG. 2 omits the illustration of the resin material 45.

As illustrated in FIG. 2, the connecting device for inspection includes a plurality of optical probes 100 and a plurality of electric probes 300. FIG. 2 illustrates a case in which the respective optical probes 100 and the respective electric probes 300 are aligned in the Y-axis direction. The connecting device for inspection thus can simultaneously inspect a plurality of optical semiconductor elements aligned in the Y-axis direction. The respective optical probes 100 and the respective electric probes 300 are positioned be aligned in the probe head 1 with a predetermined positioning accuracy. The expression "positioned with a predetermined positioning accuracy" means that the optical probes 100 are optically connected to the optical signal terminals of the optical semiconductor elements and the electric probes 300 are electrically connected to the electrical signal terminals of the optical semiconductor elements so as to ensure a necessary measurement accuracy.

The alignment of the optical probes 100 and the electric probes 300 with the optical semiconductor elements is made such that an alignment mark 60 provided in the probe head 1 is aligned with an alignment mark in a semiconductor substrate in which the optical semiconductor elements are provided. The alignment mark 60 as used herein may be either a pin type or a hole type.

Figure 3:
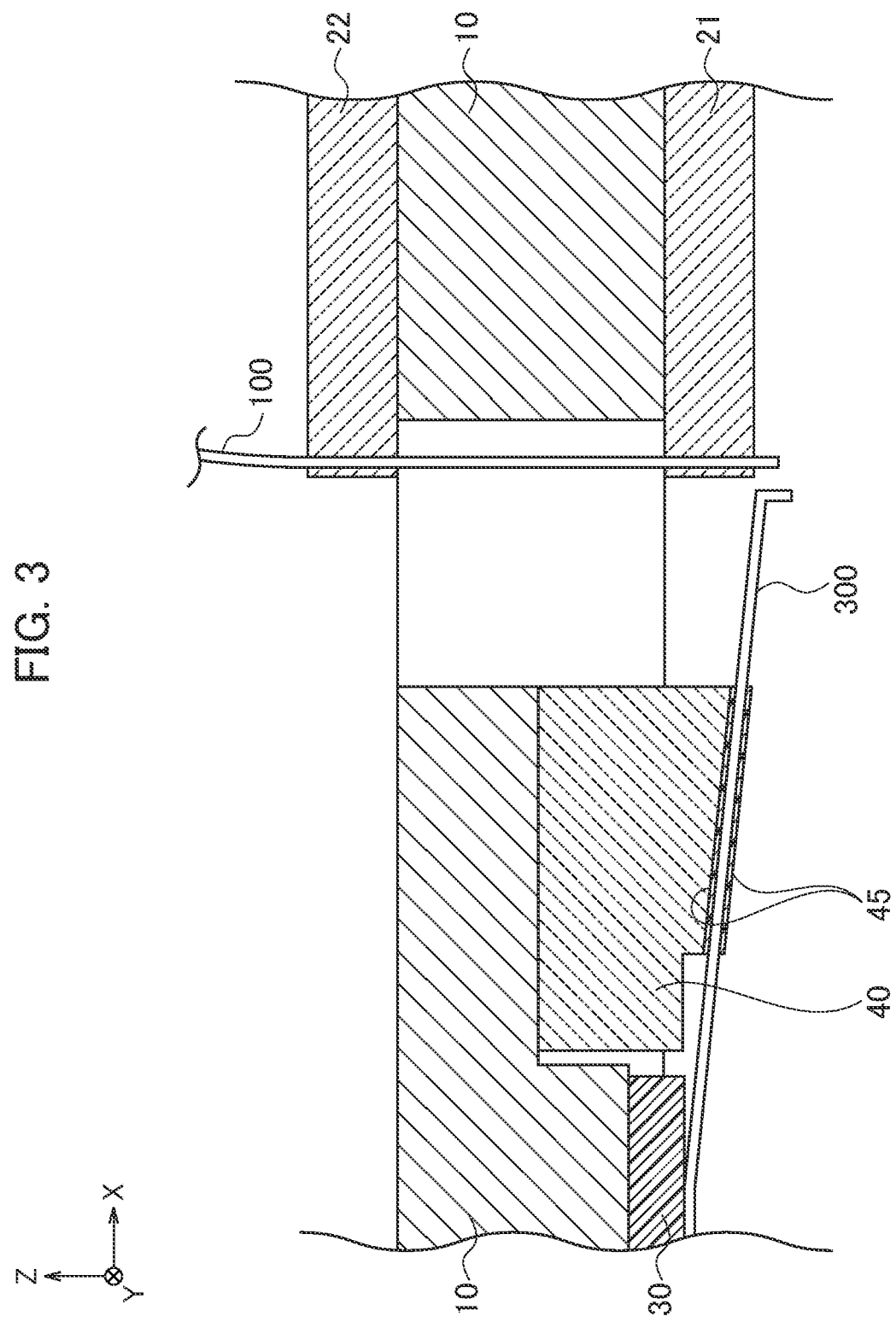
FIG. 3 is an enlarged view illustrating an optical probe and an electric probe.
Figure 4:
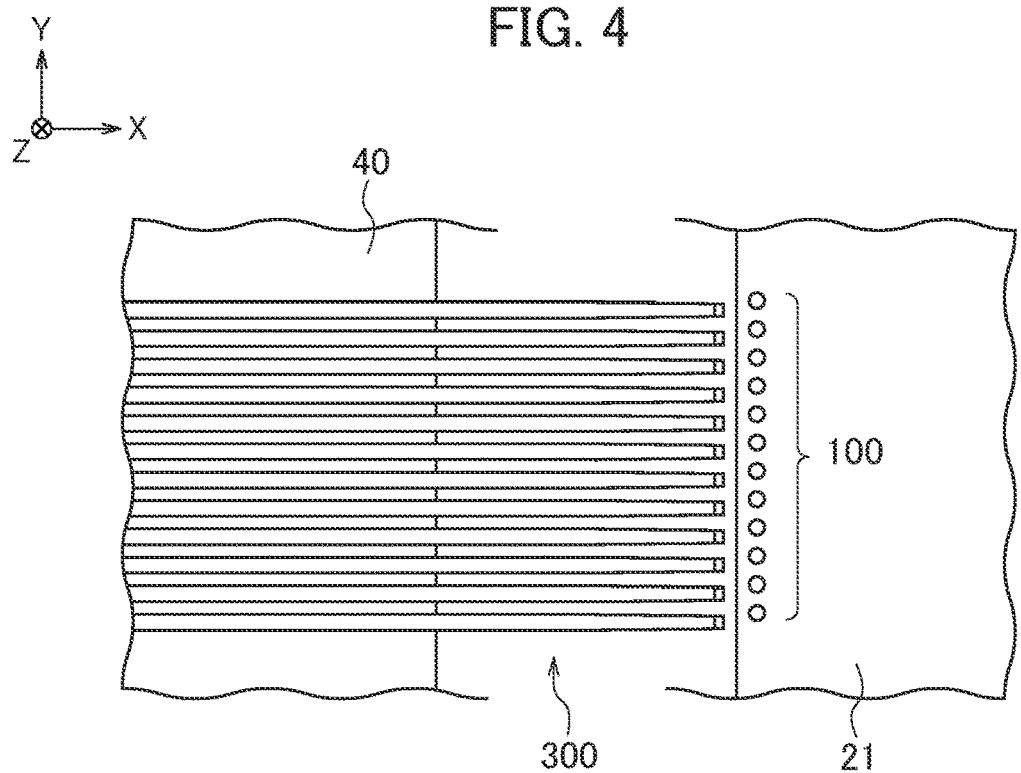
FIG. 4 is a schematic view illustrating positions of tip ends of the optical probes and the electric probes.

As illustrated in FIG. 3 and FIG. 4, the tip end part of the respective electric probes 300 is positioned adjacent to the incident end surface of the respective optical probes 100. For example, an electrical signal output from the inspection device is input to the optical semiconductor element via the electric probe 300, so as to supply electricity to the optical semiconductor element. When the optical semiconductor element is a VCSEL, the electrical signal is applied to the electrical signal terminal provided on the top surface of the VCSEL via the electric probe 300, so that the VCSEL supplied with the electricity to be turned on outputs an optical signal. The optical signal output is received by the optical probe 100.

As illustrated in FIG. 3, the electric probe 300 is fixed to the electric probe holding device 40 with the resin material 45. Removing the resin material 45 can replace the electric probes 300 one by one at a time. The wiring base plate 30 is removably attached to the probe head 1. The wiring base plate 30 thus can be replaced in a state of being connected with the electric probes 300.

Figure 5:
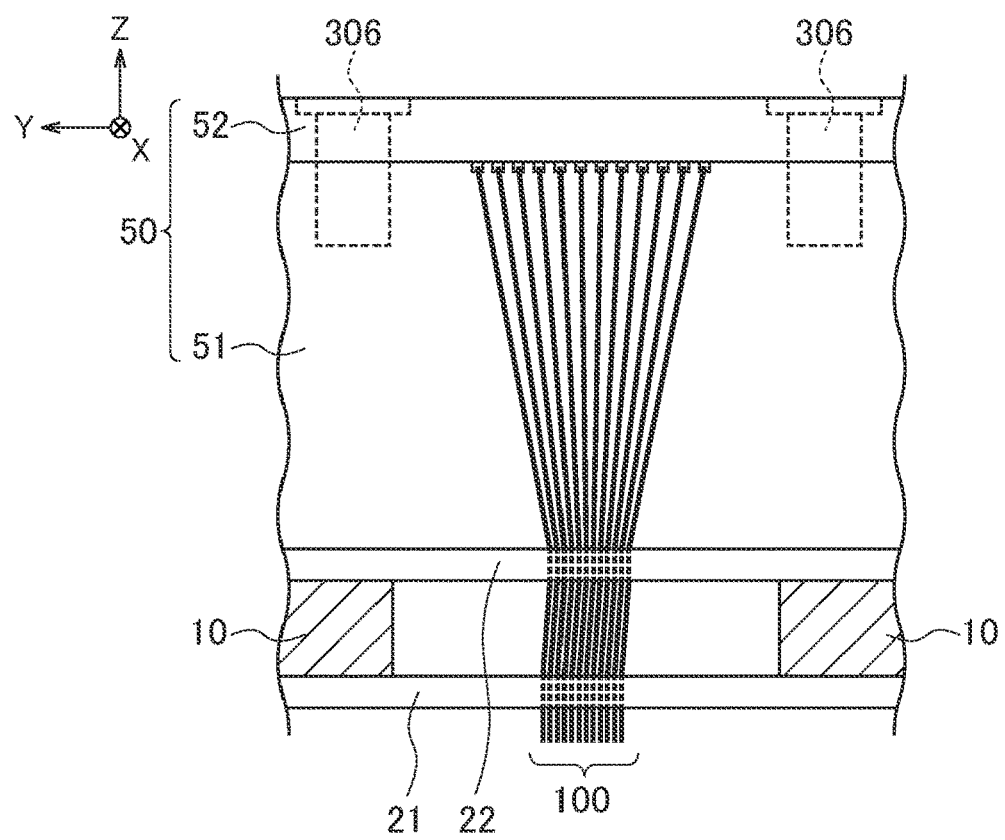
FIG. 5 is a schematic view illustrating an arrangement of guide plates of the connecting device for inspection according to the embodiment of the present invention.

As illustrated in FIG. 5, the probe head 1 holding the optical probes 100 has a configuration in which a position of the central axis of the penetration hole through which one optical probe 100 penetrates in the first guide plate 21 is shifted in the Y-axis direction from a position of the central axis of the penetration hole through which the same optical probe 100 penetrates in the second guide plate 22. The arrangement of the respective guide plates in which the positions of the central axes of the respective penetration holes are shifted is referred to below as an "offset arrangement". The optical probes 100 are curved between the first guide plate 21 and the second guide plate 22 due to the offset arrangement. A state in which the position of the central axis of the respective penetration holes in the first guide plate 21 conforms to the position of the central axis of the respective penetration holes in the second guide plate 22 is also referred to below as a state in which the positions of the respective penetration holes of the first guide plate 21 and the second guide plate 22 conform to each other.

As described above, the probe head 1 holds the optical probes 100 in the state in which the position of the central axis of the respective penetration holes in the first guide plate 21 is shifted in the radial direction of the penetration holes from the position of the central axis of the respective penetration holes in the second guide plate 22. The probe head 1 holds and interposes the optical probes 100 by the respective inner wall surfaces of the penetration holes of the first guide plate 21 and the second guide plate 22. The optical probes 100 are thus held by the probe head 1 at a constant intensity applied from the first guide plate 21 and the second guide plate 22.

The connection device for inspection including the probe head 1 positions the optical probes 100 by the first guide plate 21 in both the X-axis direction and the Y-axis direction. The optical probes 100 are held by the probe head 1 at a constant intensity due to frictional force acting between the optical probes 100 and the respective first and second guide plates 21 and 22. The optical probes 100 are thus aligned in the Z-axis direction.

The optical probes 100 can be further held strongly by the optical probe holding device 50. The optical probes 100 are fixed by the pressure applied from the upper and lower sides due to the lower holding device 51 and the upper holding device 52. This can position the optical probes 100 stably against tensile force applied from the end parts connected to the optical connectors 110.

As described above, the optical probes 100 are held by the respective inner wall surfaces of the penetration holes of the first guide plate 21 and the second guide plate 22 due to the offset arrangement. The optical probe holding device 50 also interposes the optical probes 100 between the lower holding device 51 and the upper holding device 52. The first guide plate 21 and the second guide plate 22 are fixed to the base plate 10 with the fixing screws, and the lower holding device 51 and the upper holding device 52 are fixed together with the fixing screw. Loosening the respective fixing screws releases the offset arrangement, so as to lead the positions of the penetration holes in the respective guide plates to conform to each other and also expand the gap between the lower holding device 51 and the upper holding device 52. This can facilitate the removal and insertion of the respective optical probes 100. The connection device for inspection illustrated in FIG. 1 thus can easily replace the optical probes 100 one by one at a time.

An example of a method of assembling the connecting device for inspection employing the offset arrangement is described below.

The first guide plate 21 and the second guide plate 22 each provided with the penetration holes are prepared. The first guide plate 21 is arranged on the bottom surface of the base plate 10, and the second guide plate 22 is arranged on the top surface of the base plate 10, for example. The base plate 10 is used as a spacer so as to provide a space in the region between the respective penetration holes provided in the first guide plate 21 and the respective penetration holes provided in the second guide plate 22. The respective optical probes 100 are then led to sequentially penetrate the respective penetration holes of the first guide plate 21 and the second guide plate 22 in the state in which the positions of the respective penetration holes of the first guide plate 21 and the second guide plate 22 conform to each other.

Figure 6:
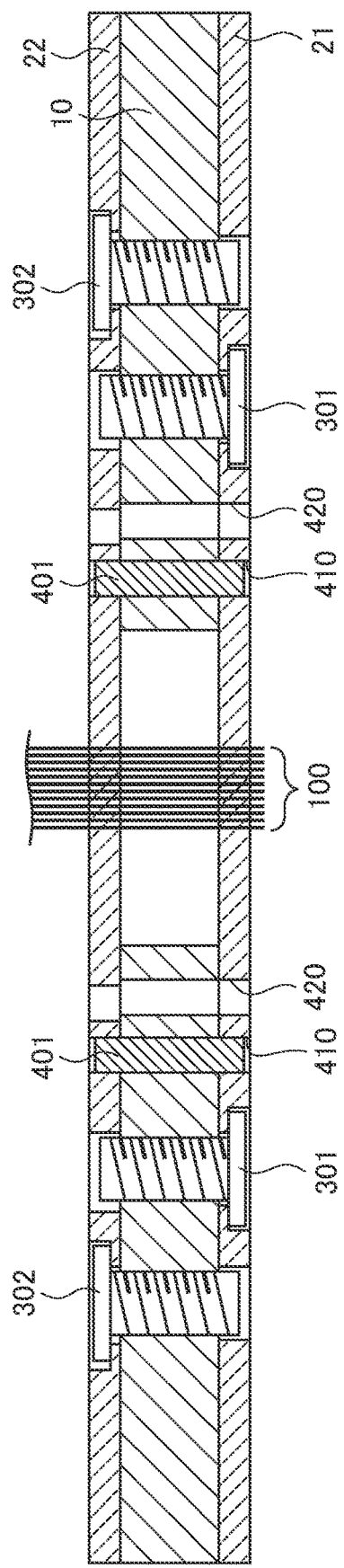
FIG. 6 is a schematic process view for explaining a method of assembling the connecting device for inspection according to the embodiment of the present invention.

At this point, as illustrated in FIG. 6, stick-like guide pins 401 are inserted to first guide holes 410 continuously penetrating through the base plate 10 from the first guide plate 21 to the second guide plate 22 in the state in which the positions of the respective penetration holes of the first guide plate 21 and the second guide plate 22 conform to each other. The central axis of the respective first guide holes 410 extends straight from the first guide plate 21 and the second guide plate 22 in the state in which the positions of the respective penetration holes of the first guide plate 21 and the second guide plate 22 conform to each other. The insertion of the stick-like guide pins 401 to the first guide holes 410 leads the positions of the first guide plate 21 and the second guide plate 22 to be stable. This facilitates the operation of inserting the optical probes 100 to the respective penetration holes in the first guide plate 21 and the second guide plate 22.

The second guide plate 22 is then moved with respect to the first guide plate 21 in the radial direction of the penetration holes in the state in which the optical probes 100 are inserted to the respective penetration holes. The execution of the offset arrangement leads the optical probes 100 to be held by the respective inner wall surfaces of the penetration holes of the first guide plate 21 and the second guide plate 22. For example, the second guide plate 22 is moved in the Y-axis direction while the position of the first guide plate 21 is fixed.

Figure 7:
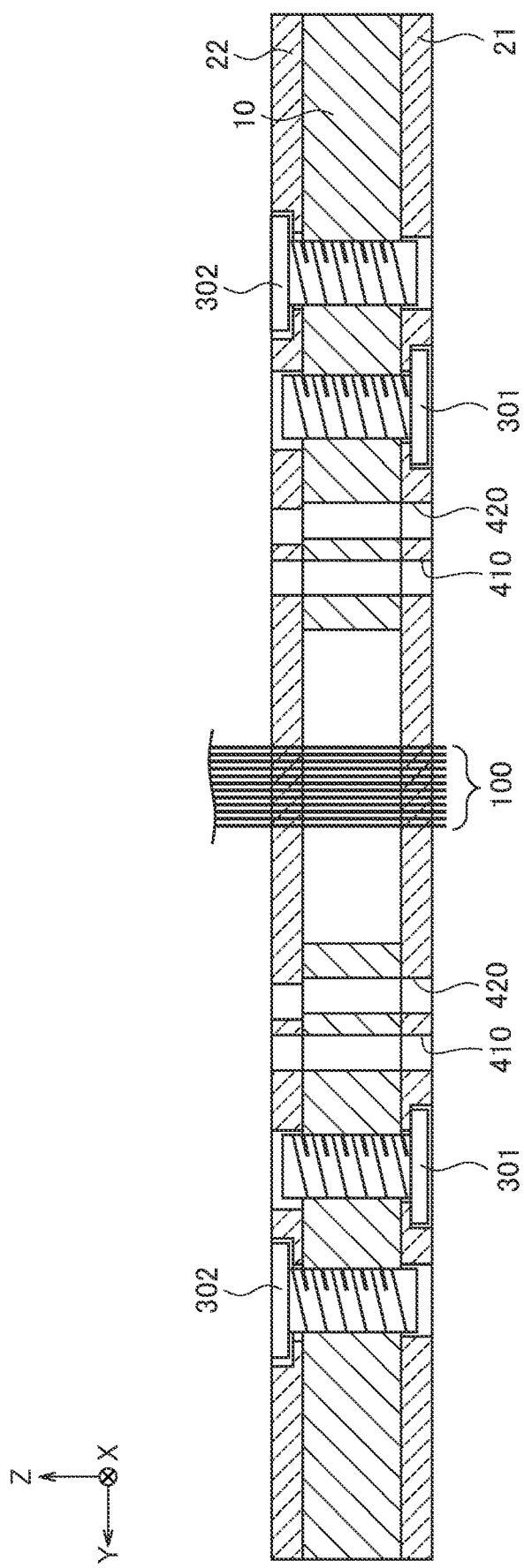
FIG. 7 is a schematic process view for explaining the method of assembling the connecting device for inspection according to the embodiment of the present invention.
Figure 8:
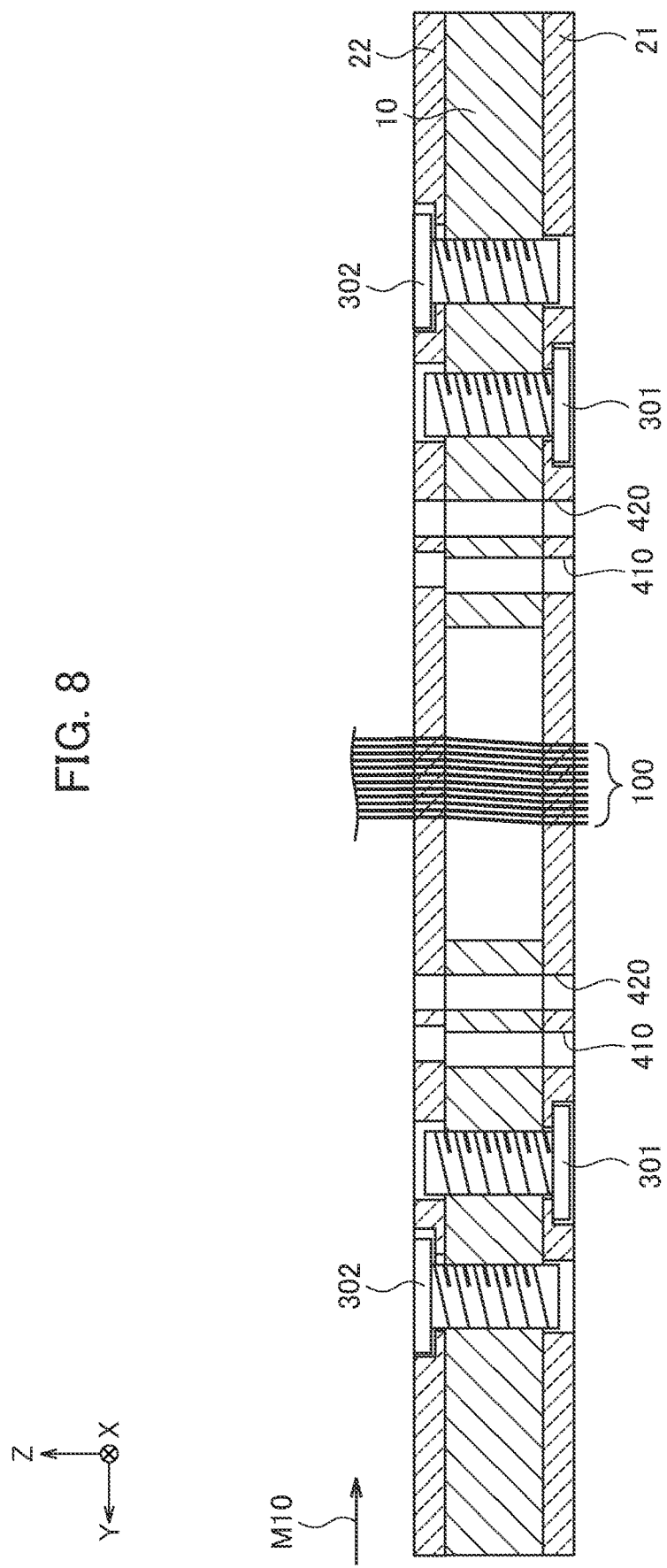
FIG. 8 is a schematic process view for explaining the method of assembling the connecting device for inspection according to the embodiment of the present invention.
Figure 9:
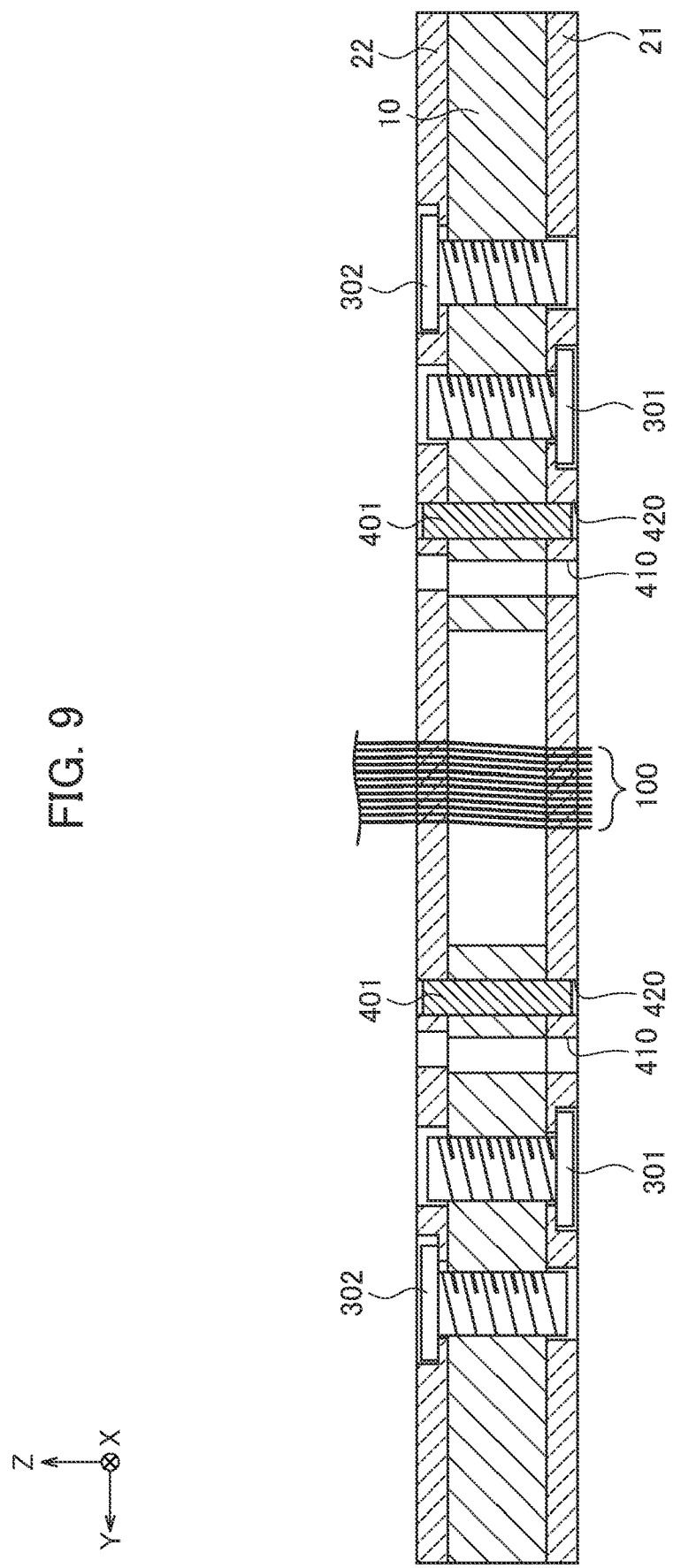
FIG. 9 is a schematic process view for explaining the method of assembling the connecting device for inspection according to the embodiment of the present invention.

Subsequently, as illustrated in FIG. 7, the stick-like guide pins 401 are removed from the first guide holes 410 and the fixing screws 302 are loosened in the state in which the optical probes 100 are inserted to the respective insertion holes of the first guide plate 21 and the second guide plate 22. The second guide plate 22 is moved with respect to the first guide plate 21 in the direction indicated by the arrow M10, as illustrated in FIG. 8. The stick-like guide pins 401 are then inserted to second guide holes 420 continuously penetrating through the base plate 10 from the first guide plate 21 to the second guide plate 22 in the state of the offset arrangement, as illustrated in FIG. 9. The second guide holes 420 are provided such that the respective central axes extend straight from the first guide plate 21 to the second guide plate 22 in state of the offset arrangement. The fixing screws 302 are then fastened so as to fix the second guide plate 22 to the base plate 10. The stick-like guide pins 401 may be removed from the probe head 1 after the respective positions of the first guide plate 21 and the second guide plate 22 are fixed.

The process as described above can achieve the offset arrangement of the connecting device for inspection. Thereafter, the optical probe holding device 50 is attached to the base plate 10, and the optical probes 100 are fixed to the optical probe holding device 50. The wiring base plate 30 to which the electric probes 300 are connected is then attached to the base plate 10. The electric wires 310 are connected to the wiring base plate 30 accordingly.

Figure 10:
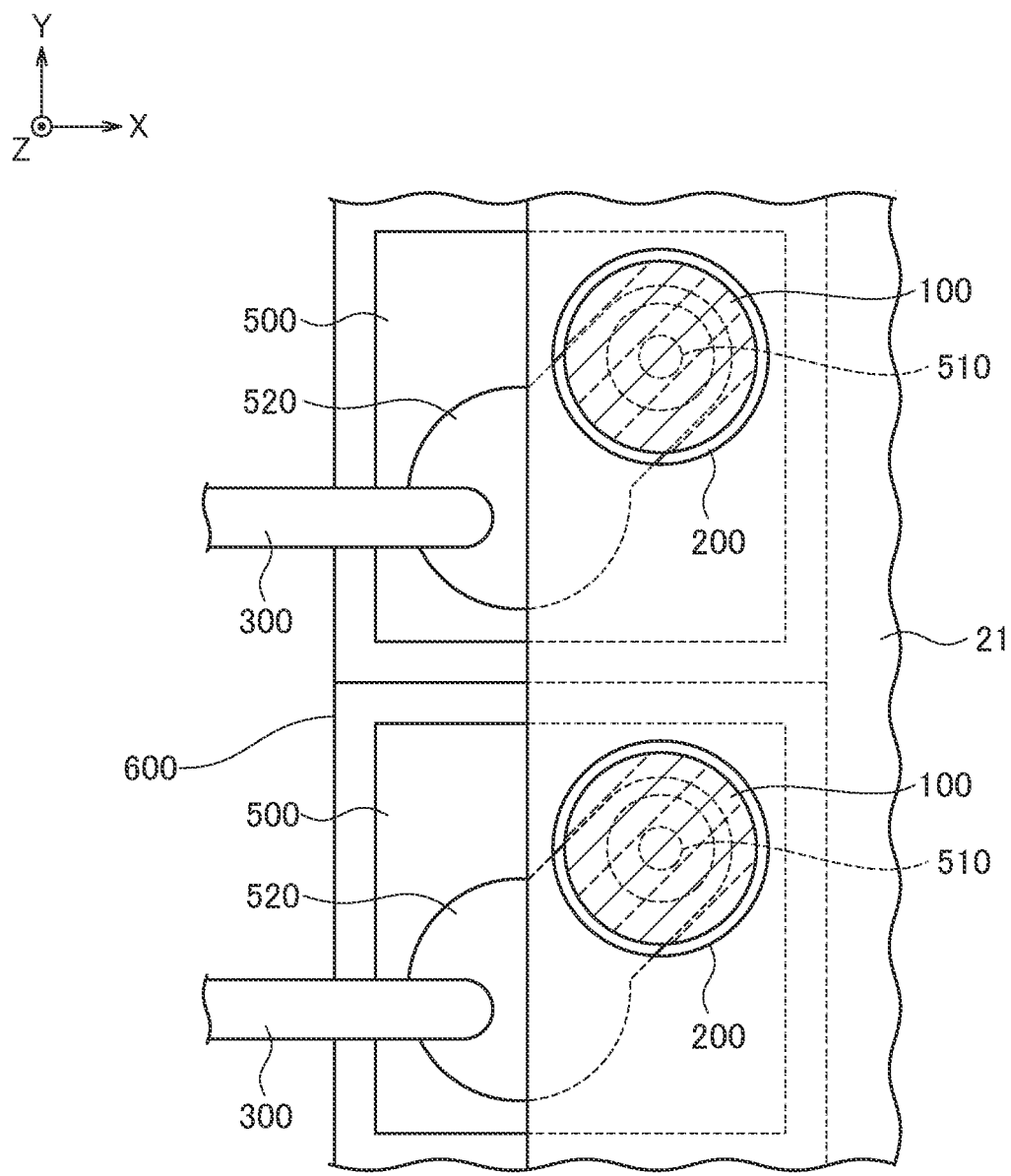
FIG. 10 is a schematic plan view illustrating a method of measuring optical semiconductor elements by use of the connecting device for inspection according to the embodiment of the present invention.
Figure 11:
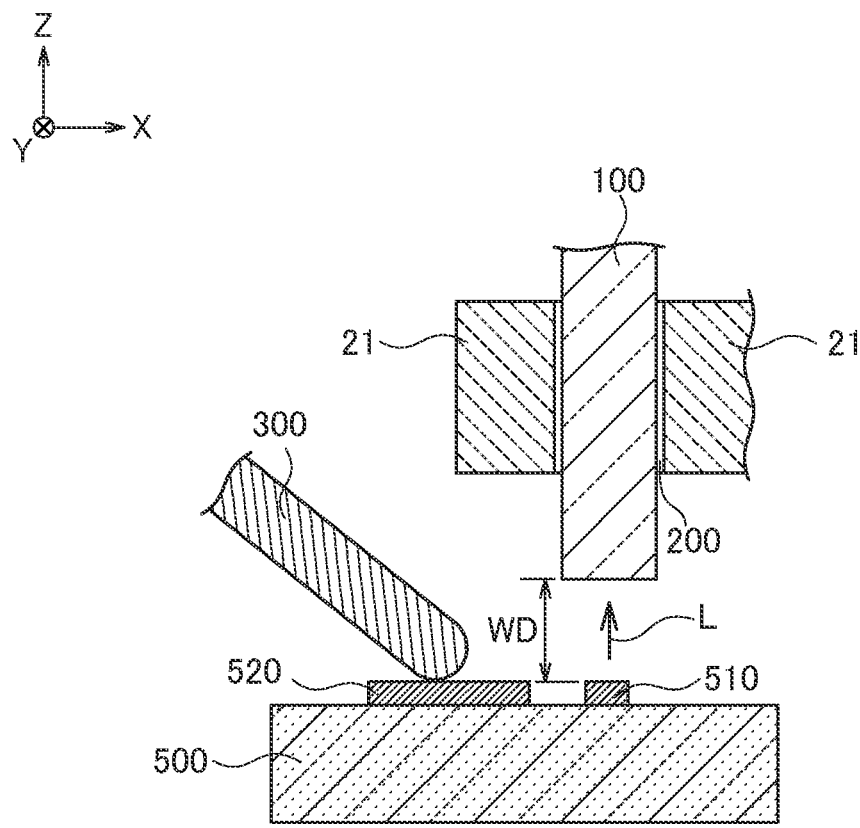
FIG. 11 is a schematic side view illustrating the method of measuring the optical semiconductor elements by use of the connecting device for inspection according to the embodiment of the present invention.

FIG. 10 and FIG. 11 illustrate an example of inspecting the optical semiconductor elements 500 by use of the connecting device for inspection. The optical semiconductor elements 500 are each a VCSEL provided with the optical signal terminal 510 and the electrical signal terminal 520 on the surface thereof. As illustrated in FIG. 10, the plural optical semiconductor elements 500 are aligned on a wafer 600 in the Y-axis direction. A pair of the optical probe 100 and the electric probe 300 is aligned to be allotted to each optical semiconductor element 500. In particular, the penetration holes 200 of the respective guide plates through which the optical probes 100 penetrate and the tip end parts of the electric probes 300 are aligned in the Y-axis direction.

A probe unit including the optical probe 100 and the electric probe 300 can be configured as described above. The probe unit is arranged to correspond to each optical semiconductor element 500 provided on the wafer 600. FIG. 10 illustrates the case in which the plural probe units are aligned in the Y-axis direction, so as to simultaneously inspect the plural optical semiconductor elements 500.

As illustrated in FIG. 11, the inspection of the optical semiconductor elements 500 is made such that the incident end surfaces of the optical probes 100 are optically connected to the optical signal terminals 510, and the tip end parts of the electric probes 300 are electrically connected to the electrical signal terminals 520. To bring the tip end parts of the electric probes 300 into contact with the electrical signal terminals 520 with a predetermined pressure, overdrive may be applied so as to push the electric probes 300 against the optical semiconductor elements 500. A working distance WD between the incident end surfaces of the optical probes 100 and the optical signal terminals 510 is regulated to a predetermined range in view of a difference between the position of the respective incident end surfaces of the optical probes 100 and the position of the respective tip end parts of the electric probes 300 in the Z-axis direction and depending on the overdrive amount.

When the optical semiconductor elements 500 are inspected, the electrical signals are input to the electrical signal terminals 520 via the electric probes 300 so as to supply electricity to the optical semiconductor elements 500. The optical probes 100 then receive the optical signals L output from the optical signal terminals 510 of the optical semiconductor elements 500.

Figure 12:
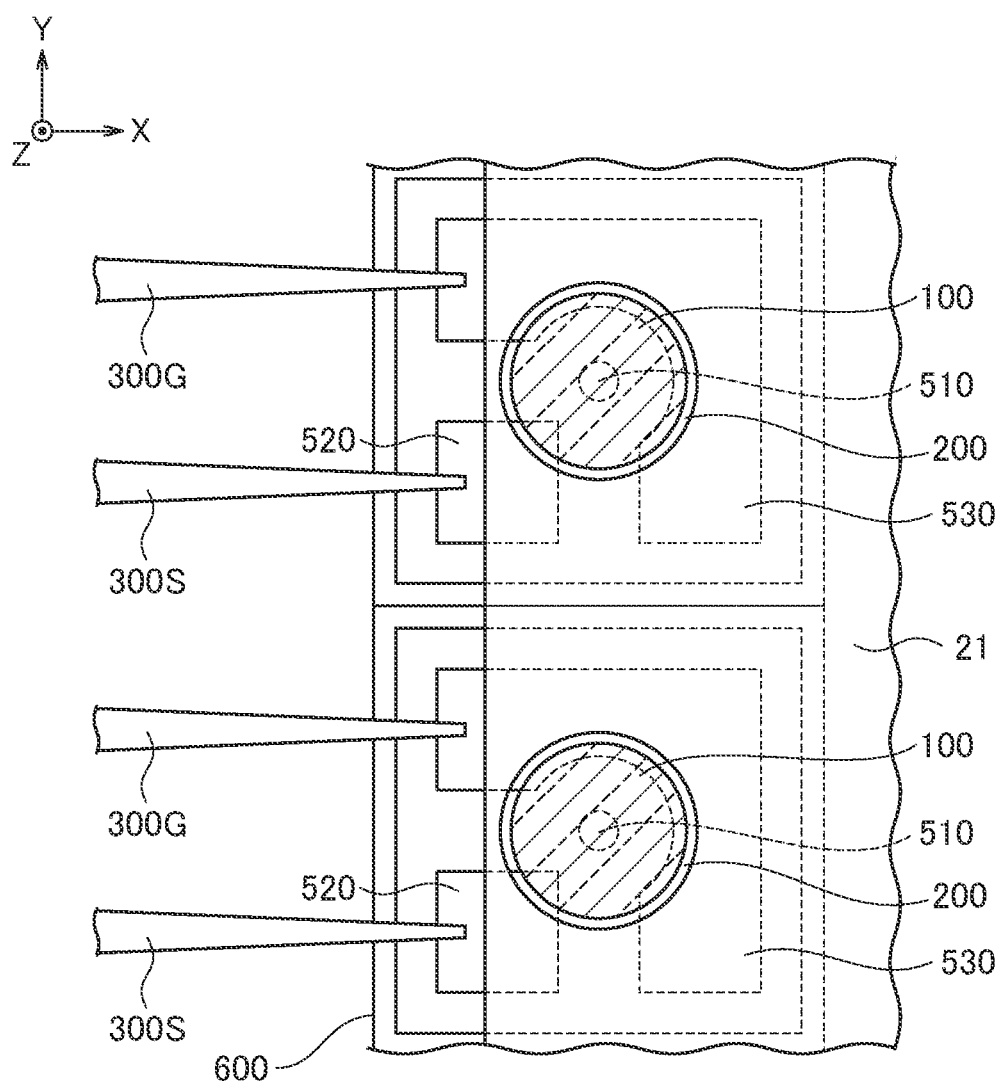
FIG. 12 is a schematic plan view illustrating a method of measuring the optical semiconductor elements by use of another example of the connecting device for inspection according to the embodiment of the present invention.

While FIG. 10 illustrates the case in which each probe unit is composed of the single optical probe 100 and the electric probe 300, the number of the optical probes 100 and the electric probes 300 included in the respective probe units is determined as appropriate depending on the configuration and the measurement contents of the optical semiconductor elements. For example, as illustrated in FIG. 12, a pair of an electric probe 300S for power supply and an electric probe 300G for ground may be used for each probe unit. The electric probe 300S for power supply is electrically connected to the electrical signal terminal 520 of the optical semiconductor element 500. The electric probe 300G for ground is electrically connected to a GND terminal 530 of the optical semiconductor element 500. Both the electric probe 300S for power supply and the electric probe 300G for ground thus can be used together with the single optical probe 100 so as to compose each probe unit.

As described above, the connecting device for inspection according to the embodiment has the configuration in which the probe head 1 holds the optical probes 100 such that the first guide plate 21 and the second guide plate 22 interpose the optical probes 100 by the offset arrangement. The optical probes 100 thus can be easily replaced one by one at a time. The positioning of the optical probes 100 in the X-axis direction and the Y-axis direction is made by the first guide plate 21. The positioning of the optical probes 100 in the Z-axis direction is achieved due to the offset arrangement. The connecting device for inspection according to the embodiment thus can easily and simultaneously position the plural optical probes 100.

Various kinds of methods can be used for achieving the offset arrangement. An example of the methods is described below with reference to FIG. 13 and FIG. 14, instead of the method described above with reference to FIG. 6 to FIG. 9.

Figure 13:
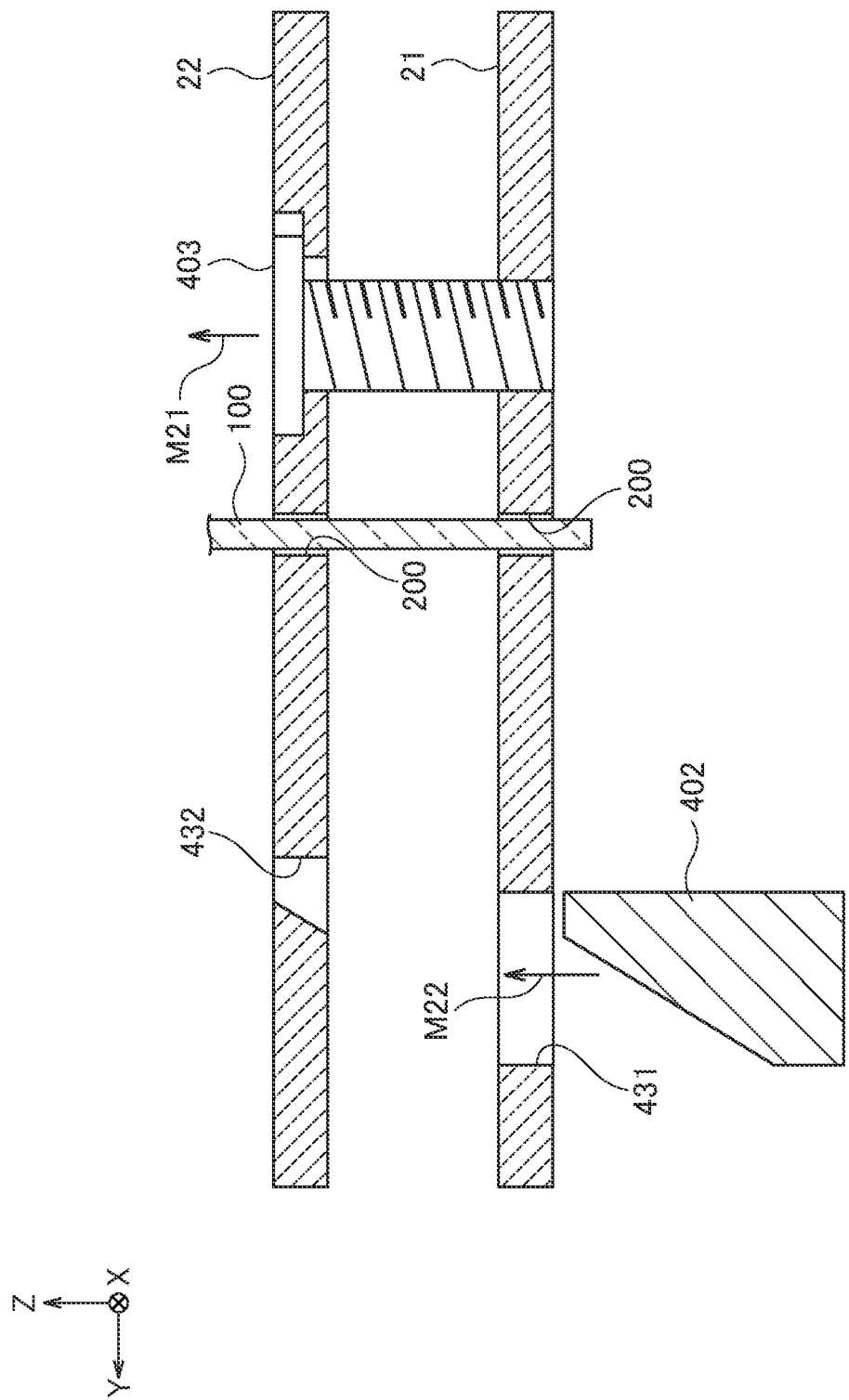
FIG. 13 is a schematic process view for explaining another method of assembling the connecting device for inspection according to the embodiment of the present invention.

As illustrated in FIG. 13, the first guide plate 21 provided with a first insertion hole 431 and the second guide plate 22 provided with a second insertion hole 432 are prepared. A width of the first insertion hole 431 in the Y-axis direction is greater than that of the second insertion hole 432 in the Y-axis direction. The position of the first insertion hole 431 is displaced from the position of the second insertion hole 432, while the positions of the respective penetration holes 200 of the first guide plate 21 and the second guide plate 22 conform to each other. The displaced distance corresponds to a distance in which the second guide plate 22 is moved in the state of the offset arrangement. The relative positions between the first guide plate 21 and the second guide plate 22 are fixed due to a fixing screw 403 penetrating from the second guide plate 22 to the first guide plate 21.

Figure 14:
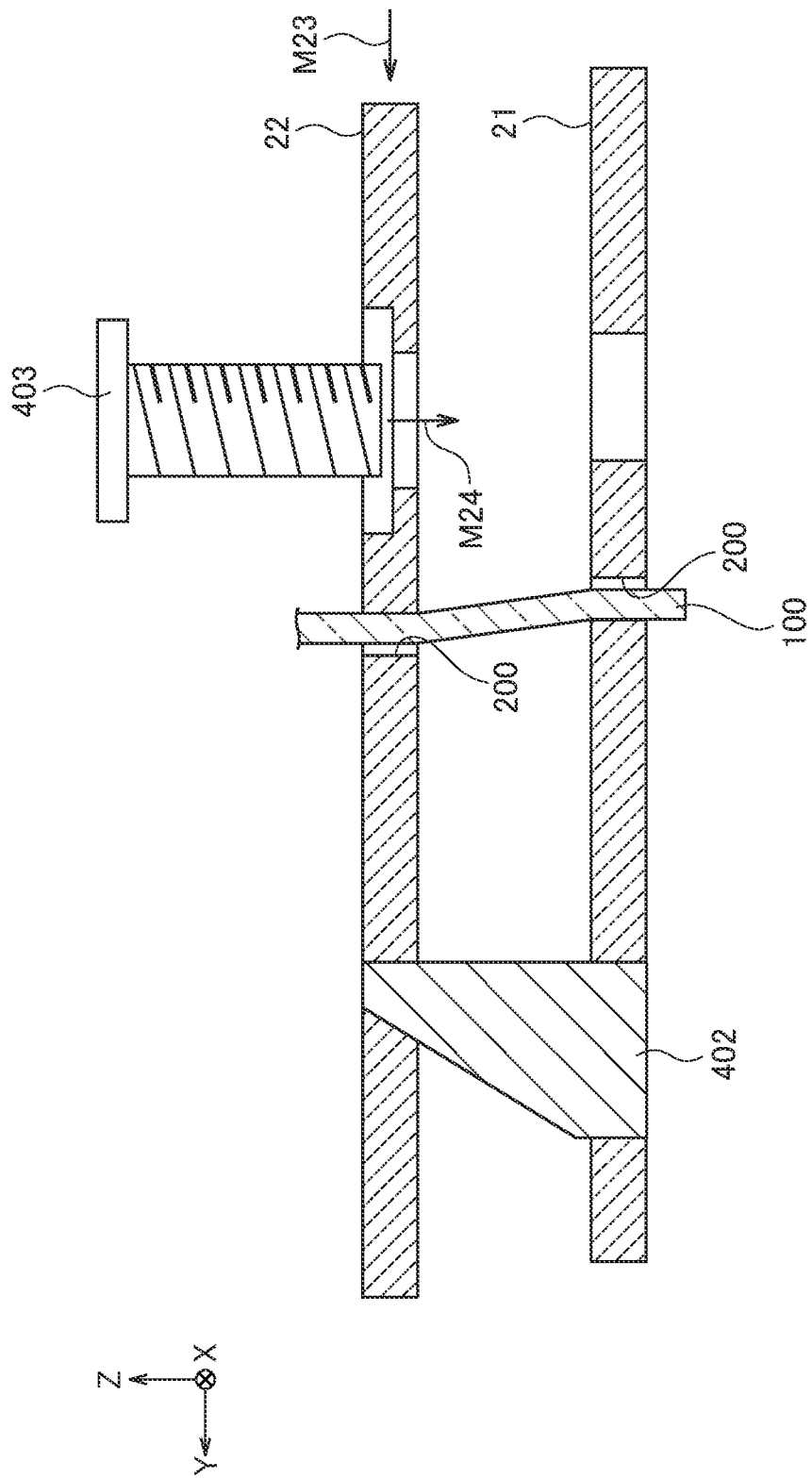
FIG. 14 is a schematic process view for explaining the other method of assembling the connecting device for inspection according to the embodiment of the present invention.

The fixing screw 403 is removed as indicated by the arrow M21 in FIG. 13. A wedge-shaped guide pin 402 is then inserted through the first guide plate 21 toward the second guide plate 22, as indicated by the arrow M22 in FIG. 13. The wedge-shaped guide pin 402 has a shape in which the upper side is shorter than the lower side in the Y-axis direction. The wedge-shaped guide pin 402 has a narrower width at the position inserted to the second guide plate 22 than at the position inserted to the first guide plate 21. The inner wall surface of the second insertion hole 432 is inclined to have a width wider on the lower side to conform to the shape of the wedge-shaped guide pin 402. The second guide plate 22 is thus gradually moved in the Y-axis direction as the wedge-shaped guide pin 402 is inserted to the second insertion hole 432 in the Z-axis direction, as indicated by the arrow M23 in FIG. 14. When the wedge-shaped guide pin 402 is inserted to reach the predetermined position in the respective guide plates, as illustrated in FIG. 14, the first guide plate 21 and the second guide plate 22 are positioned in the state of the offset arrangement. The fixing screw 403 is then inserted from the second guide plate 22 to the first guide plate 21 as indicated by the arrow M24 in FIG. 14, so as to fix the second guide plate 22 with respect to the first guide plate 21. The wedge-shaped guide pin 402 may be removed from the respective guide plates after the second guide plate 22 is fixed.

To insert the fixing screw 403 to the second guide plate 22 before and after the offset arrangement, the screw hole in the second guide plate 22 to which the fixing screw 403 is inserted is formed to have a width greater than the fixing screw 403 in the Y-axis direction. Alternatively, a first screw hole may be formed in each of the first guide plate 21 and the second guide plate 22 such that the respective central axes conform to each other before the offset arrangement, and a second screw hole may be formed in each of the first guide plate 21 and the second guide plate 22 such that the respective central axes conform to each other after the offset arrangement. The fixing screw 403 is then inserted to the respective screw holes before and after the offset arrangement.

Modified Example

While the embodiment is illustrated above with the case in which the probe head 1 includes the two guide plates, the number of the guide plates included in the probe head 1 is not limited to two. For example, the probe head 1 may further include a third guide plate arranged separately from the first guide plate 21 and the second guide plate 22 in the central axis direction of the penetration holes. The third guide plate is arranged movably with respect to at least either the first guide plate 21 or the second guide plate 22 in the radial direction of the penetration holes in the state in which the optical probes 100 are inserted to the respective penetration holes. The probe head 1 may hold the optical probes 100 in a state in which the position of the central axis of the respective penetration holes in the third guide plate is shifted in the radial direction of the penetration holes from the position of the central axis of the respective penetration holes in either the first guide plate 21 or the second guide plate 22 adjacent and closer to the third guide plate.

Figure 15:
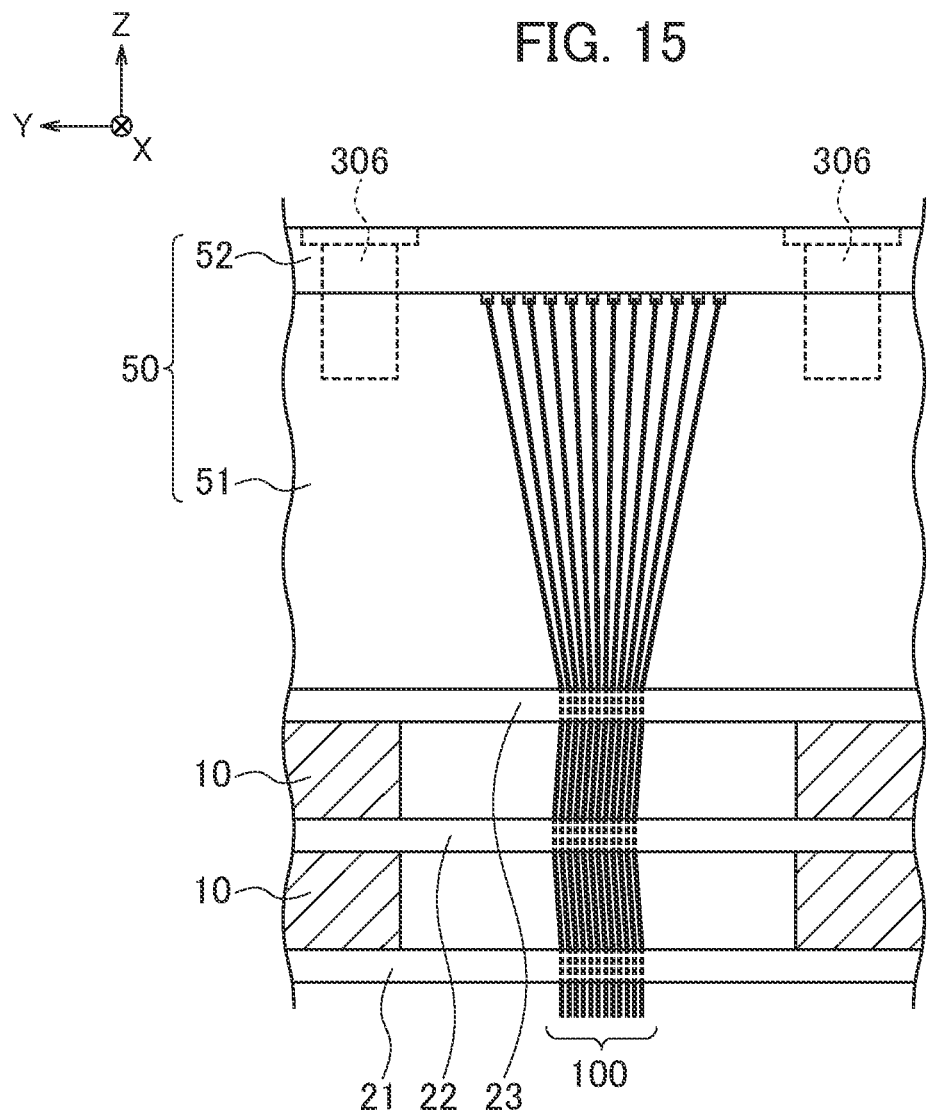
FIG. 15 is a schematic view illustrating an arrangement of guide plates of a connecting device for inspection according to a modified example of the embodiment of the present invention.

For example, as illustrated in FIG. 15, the probe head 1 may include the third guide plate 23 arranged on the upper side of the second guide plate 22. The probe head 1 illustrated in FIG. 15 has a configuration in which not only the first guide plate 21 and the second guide plate 22 are positioned in the state of the offset arrangement but also the second guide plate 22 and the third guide plate 23 are positioned in the state of the offset arrangement. The double offset arrangements can increase the force of holding the optical probes 100 by the probe head 1. The optical probes 100 still can be easily replaced regardless of whether the number of the guide plates is increased such that the offset arrangements are released so that the positions of the penetration holes of the respective guide plates conform to each other.

The plural offset arrangements can be achieved by either the method as described with reference to FIG. 6 to FIG. 9 or the method as described with reference to FIG. 13 and FIG. 14. For example, the third guide plate 23 is first placed separately from the first guide plate 21 and the second guide plate 22 in the central axis direction of the penetration holes. The position of the central axis of the respective penetration holes in the first guide plate 21, the position of the central axis of the respective penetration holes in the second guide plate 22, and the position of the central axis of the respective penetration holes in the third guide plate 23 are led to conform to each other. The optical probes 100 are then sequentially inserted to the respective penetration holes in the first guide plate 21, the second guide plate 22, and the third guide plate 23. The second guide plate 22 is moved with respect to the first guide plate 21 and the third guide plate 23 in the radial direction of the penetration holes in the state in which the optical probes 100 are inserted to the penetration holes. Alternatively, the second guide plate 22 may be moved first with respect to the first guide plate 21, and the third guide plate 23 then may be moved with respect to the second guide plate 22. The optical probes 100 are thus held by the respective inner wall surfaces of the penetration holes in the first guide plate 21, the second guide plate 22, and the third guide plate 23.

Other Embodiments

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

For example, the above embodiment is illustrated with the case in which the second guide plate 22 is movably arranged with respect to the first guide plate 21 located at the position closer to the incident end surfaces of the optical probes 100 to be opposed to the optical semiconductor elements. Alternatively, the first guide plate 21 may be movably arranged while the position of the second guide plate 22 is fixed.

Figure 16:
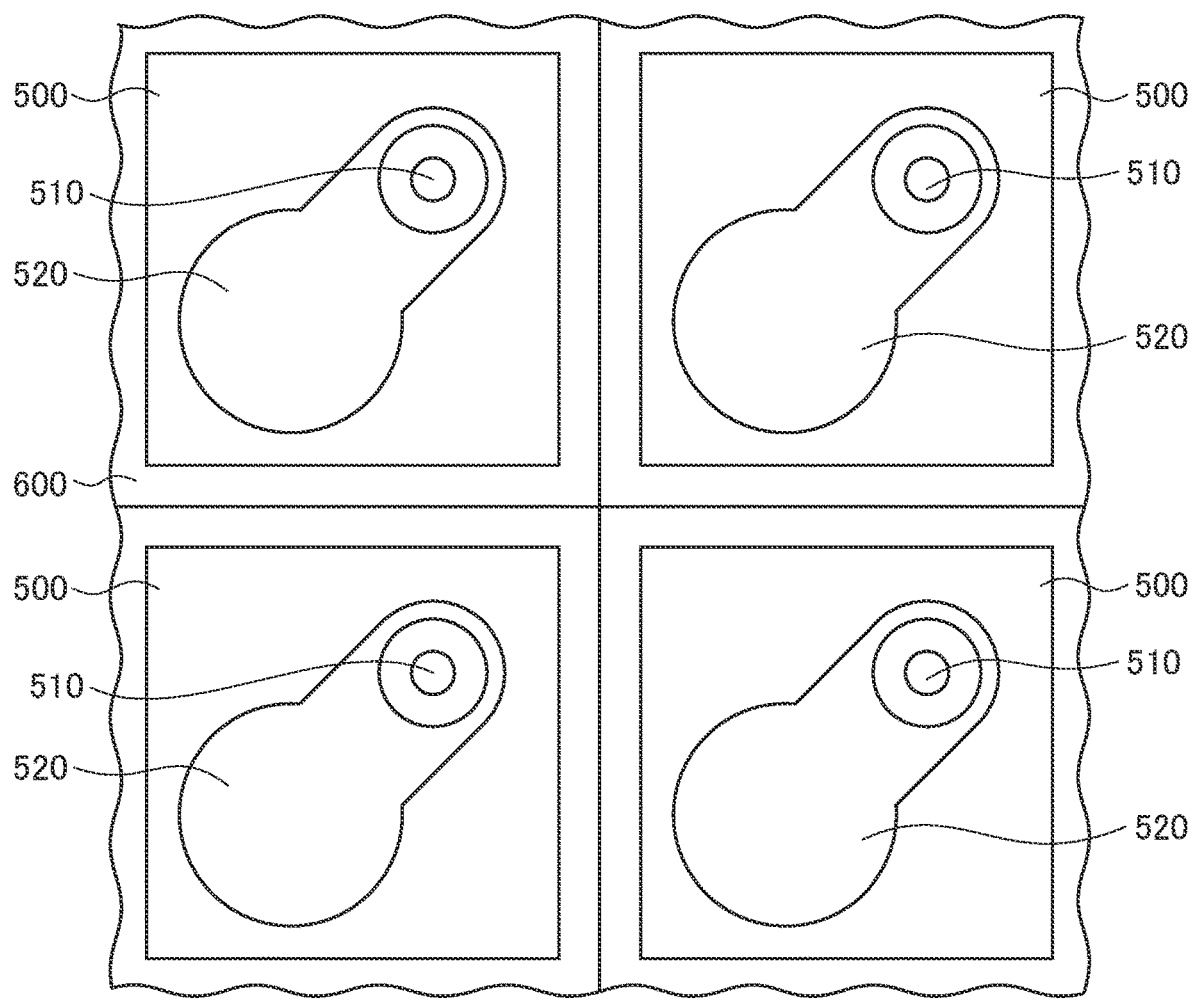
FIG. 16 is a schematic view illustrating another example of the optical semiconductor elements to be inspected.

While the above embodiment is illustrated with the case in which the optical probes 100 and the electric probes 300 are aligned in the Y-axis direction, the optical probes 100 and the electric probes 300 may be aligned in the X-axis direction. Alternatively, the optical probes 100 and the electric probes 300 may be arranged in both the X-axis direction and the Y-axis direction. This arrangement can simultaneously inspect the plural optical semiconductor elements arranged in a matrix form on the wafer 600 as illustrated in FIG. 16, for example.

The proximal end parts of the electric probes 300 may be directly connected to the electric wires 310 without interposing the wiring base plate 30. A coaxial wire may be used for the respective electric wires 310 so as to inspect the high-frequency characteristics of the optical semiconductor elements.

While the above embodiment is illustrated with the case in which the optical probes 100 receive the optical signals output from the optical semiconductor elements, the connecting device for inspection according to the embodiment can be used for a case of inspection that outputs optical signals from the optical probes 100 toward the optical semiconductor elements.

As described above, it is natural that the present invention incorporates a variety of embodiments which are not described herein.

What is claimed is:

1. A connecting device for inspection used for inspecting an optical semiconductor element that receives or outputs an optical signal, the device comprising:
   an optical probe; and
   a probe head including a plurality of guide plates each provided with a penetration hole through which the optical probe penetrates, the guide plates arranged separately from each other in a central axis direction of the respective penetration holes,
   the guide plates of the probe head including:
      a first guide plate; and
      a second guide plate arranged movably with respect to the first guide plate in a radial direction of the penetration holes in a state in which the optical probe is inserted to the respective penetration holes,
   the probe head holding the optical probe by an inner wall surface of the penetration hole of the first guide plate and an inner wall surface of the penetration hole of the second guide plate in a state in which a position of a central axis of the penetration hole of the first guide plate is shifted in the radial direction from a position of a central axis of the penetration hole of the second guide plate.

2. The connecting device for inspection according to claim 1, wherein the first guide plate is located closer to a tip end of the optical probe opposed to the optical semiconductor element than the second guide plate.

3. The connecting device for inspection according to claim 1, further comprising an optical probe holding device configured to hold the optical probe at a position farther away from the optical semiconductor element than the respective guide plates.

4. The connecting device for inspection according to claim 1, wherein:
   the probe head further includes a third guide plate arranged separately from the first guide plate and the second guide plate in the central axis direction of the respective penetration holes; and
   the third guide plate is arranged movably with respect to at least either the first guide plate or the second guide plate in the radial direction in the state in which the optical probe is inserted to the respective penetration holes.

5. The connecting device for inspection according to claim 1, further comprising:
   an electric probe; and
   an electric probe holding device configured to hold the electric probe,
   wherein a tip end part of the electric probe is electrically connected to an electrical signal terminal of the optical semiconductor element in a state in which the optical probe is optically connected to an optical signal terminal of the optical semiconductor element.

* * * * *